United States Patent
Yamazaki et al.

(10) Patent No.: US 7,550,769 B2
(45) Date of Patent: Jun. 23, 2009

(54) LIGHT EMITTING ELEMENT, LIGHT EMITTING DEVICE AND SEMICONDUCTOR DEVICE

(75) Inventors: Shunpei Yamazaki, Tokyo (JP); Kengo Akimoto, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/143,673

(22) Filed: Jun. 3, 2005

(65) Prior Publication Data
US 2005/0274949 A1 Dec. 15, 2005

(30) Foreign Application Priority Data
Jun. 11, 2004 (JP) ............... 2004-174852

(51) Int. Cl.
*H01L 29/04* (2006.01)
(52) U.S. Cl. .................. 257/72; 257/83; 257/E51.019
(58) Field of Classification Search .............. 257/59, 257/72, 83, E51.019
See application file for complete search history.

(56) References Cited

U.S. PATENT DOCUMENTS

| 6,329,275 | B1 | 12/2001 | Ishigami et al. | |
|---|---|---|---|---|
| 6,592,812 | B1 | 7/2003 | Kubota et al. | |
| 6,929,873 | B2 * | 8/2005 | Tsuboyama et al. | 428/690 |
| 7,008,519 | B2 | 3/2006 | Takahashi et al. | |
| 2003/0008217 | A1 | 1/2003 | Kobayashi | |
| 2003/0015960 | A1 | 1/2003 | Seo et al. | |
| 2004/0022664 | A1 | 2/2004 | Kubota et al. | |
| 2004/0046908 | A1 | 3/2004 | Shih et al. | |
| 2004/0184137 | A1 * | 9/2004 | Kaneko et al. | 359/296 |
| 2005/0051770 | A1 | 3/2005 | Ando et al. | |
| 2005/0247939 | A1 * | 11/2005 | Iketsu et al. | 257/66 |
| 2006/0145159 | A1 * | 7/2006 | Yokoyama et al. | 257/72 |

FOREIGN PATENT DOCUMENTS

| JP | 62-235453 | * 10/1987 |
|---|---|---|
| JP | 10-183337 | 7/1998 |
| JP | 2003-059655 | 2/2003 |
| JP | 2003-59666 | 2/2003 |
| JP | 2003-059666 | 2/2003 |
| JP | 2003-105532 | 4/2003 |
| JP | 2003-277921 | 10/2003 |
| WO | WO 97/13885 | 4/1997 |

* cited by examiner

*Primary Examiner*—Tuan N. Quach
(74) *Attorney, Agent, or Firm*—Nixon Peabody LLP; Jeffrey L. Costellia; Marc W. Butler

(57) ABSTRACT

It is an object of the present invention to provide a semiconductor device, in particular, a light emitting element which can be easily manufactured with a wet method. One feature of the invention is a light emitting device including a transistor and a light emitting element. In the light emitting element, an organic layer, a light emitting layer, and a second electrode are sequentially formed over a first electrode, and the transistor is electrically connected to the light emitting element through a wiring. Here, the wiring contains aluminum, carbon, and titanium. The organic layer is formed by a wet method. The first electrode which is in contact with the organic layer is formed from indium tin oxide containing titanium oxide.

34 Claims, 8 Drawing Sheets

LIGHT EMITTING ELEMENT, LIGHT EMITTING DEVICE AND SEMICONDUCTOR DEVICE

BACKGROUND OF THE INVENTION

1. Field of the Invention

The present invention relates to a light emitting element having a light emitting layer between a pair of electrodes, a light emitting device including the light emitting element, and generally relates to other semiconductor devices.

2. Description of the Related Art

These days, most of light emitting elements utilized for a display or the like has a structure in which a light emitting layer is interposed between a pair of electrodes. In such the light emitting element, light is emitted when an exciton formed by recombining an electron injected from one of the electrodes and a hole injected from another electrode returns to the ground state.

There is an ink-jet method or a coating method as a method for forming a light emitting layer. These are methods by which solution in which a material for forming a light emitting layer is dissolved is applied using an ink-jet apparatus, a spin-coating apparatus, or the like and then is dried.

In the case of using an ink-jet method or a coating method as described above, coating is not suitably performed if an object to be treated has low wettability, which contributes to a poor element.

Therefore, for example, a method for manufacturing an electroluminescent element by which a favorable organic EL layer is formed by forming with the use of a printing matrix which has a predetermined hydrophilic pattern formed by using a wettability changing layer is disclosed in Patent Document 1 (Patent Document 1: Japanese Patent Laid-Open No. 2003-59655).

However, a method as in Patent Document 1 has trouble with the adjustment or the like of a material for forming the wettability changing layer.

SUMMARY OF THE INVENTION

It is an object of the present invention to provide a light emitting element which is easily manufactured with a wet method.

One feature of the invention is a light emitting element in which an organic layer, a light emitting layer, and a second electrode are sequentially formed over a first electrode. Here, the organic layer is formed by a wet method. The first electrode which is in contact with the organic layer contains titanium oxide and can transmit visible light.

Another feature of the invention is a light emitting element in which an organic layer, a light emitting layer, and a second electrode are sequentially formed over a first electrode. Here, the organic layer is formed by a wet method. The first electrode which is in contact with the organic layer is composed of indium tin oxide containing titanium oxide.

Another feature of the invention is a light emitting device including a transistor and a light emitting element. The light emitting element is formed by sequentially forming an organic layer, a light emitting layer, and a second electrode over a first electrode, and the transistor and the light emitting element are electrically connected to each other through a wiring. Here, the wiring contains aluminum, carbon, and titanium. The organic layer is formed by a wet method. The first electrode which is in contact with the organic layer is composed of indium tin oxide containing titanium oxide.

According to the invention, a light emitting element having a few poor elements due to failure of a layer formed by a wet method can be obtained. In addition, a light emitting device which can easily make ohmic contact between a wiring and an electrode of the light emitting element and further has little poor light emitting element due to failure of a layer formed by a wet method can be obtained.

These and other objects, features and advantages of the present invention will become more apparent upon reading of the following detailed description along with the accompanied drawings.

DETAILED DESCRIPTION OF THE INVENTION

Hereinafter, embodiment modes according to the present invention are described. However, it is easily understood by those who are skilled in the art that embodiments and details herein disclosed can be modified in various ways without departing from the purpose and the scope of the invention. Therefore, it should be noted that the description of embodiment modes to be given below should not be interpreted as limiting the invention.

Embodiment Mode 1

Figure 1:
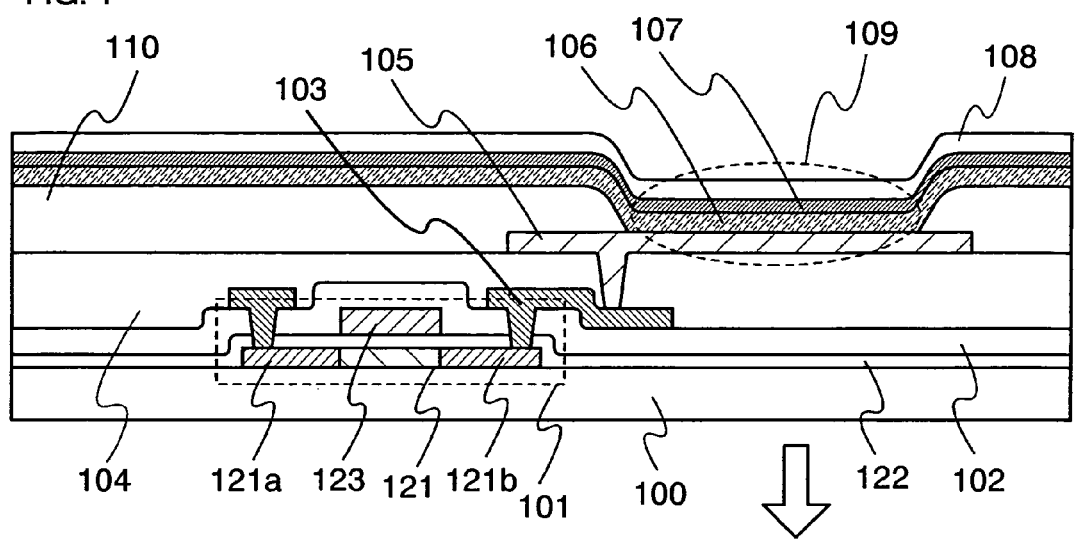
FIG. 1 is an explanatory view of a light emitting element and a light emitting device according to the present invention.

One mode of a light emitting device according to the invention is described with reference to FIG. 1.

A transistor 101 and the like are manufactured over a substrate 100. Here, the substrate 100 is not limited in particular, and a substrate having flexibility such as a plastic substrate as well as a glass substrate, a quartz substrate, or the like can be used. Further, the transistor 101 shown in FIG. 1 is a top-gate transistor in which a gate insulating layer 122 and a gate electrode 123 are sequentially formed over a semiconductor layer 121; however, the structure of a transistor is not limited in particular, and a bottom-gate transistor may be used as well as the top-gate transistor. Further, an element such as a capacitor element may be manufactured as well as a transistor. The semiconductor layer which is included in the transistor 101 may be a semi-amorphous layer or the like as well as a layer containing a crystalline component or a layer containing a non-crystalline component.

A semi-amorphous semiconductor is described as follows. A semi-amorphous semiconductor has an intermediate structure between an amorphous structure and a crystalline structure (including a single crystalline and polycrystalline structure), a third state which is stable in terms of free energy, and a crystalline region having a short-range order and lattice distortion. In addition, at least a part of the film includes a crystal grain having a grain diameter of from 0.5 nm to 20 nm. The Raman spectrum shifts to the lower wavenumber side than 520 cm$^{-1}$. Diffraction peaks of (111) and (220) which is thought to be derived from Si crystalline lattice are observed by X-ray diffraction. At least 1 atomic % or more of hydrogen or halogen is contained in the semi-amorphous semiconductor in order to terminate a dangling bond. The semi-amorphous semiconductor is also referred to as a so-called microcrystal semiconductor. It is formed by glow discharge decomposition (plasma CVD) of a silicide gas. SiH$_4$, additionally, Si$_2$H$_6$, SiH$_2$Cl$_2$, SiHCl$_3$, SiCl$_4$, SiF$_4$, or the like can be used as the silicide gas. The silicide gas may be diluted with H$_2$, or H$_2$ and one or more kinds of rare gas elements selected from He, Ar, Kr, and Ne. Dilution ratio is in the range of from 2 times to 1000 times. Pressure is in the range of approximately from 0.1 Pa to 133 Pa, and power frequency is from 1 MHz to 120 MHz, preferably, from 13 MHz to 60 MHz. The temperature for heating a substrate may be 300° C. or less, preferably, in the range of from 100° C. to 250° C. As for an impurity element in the film, impurities of atmospheric component such as oxygen, nitrogen, or carbon are preferably set to be 1×10$^{20}$/cm$^3$ or less, in particular, the oxygen concentration is set to be 5×10$^{19}$/cm$^3$ or less, preferably, 1×10$^{19}$/cm$^3$ or less. Further, mobility of a TFT (a thin film transistor) using a semi-amorphous semiconductor is approximately from 1 cm$^2$/Vsec to 10 cm$^2$/Vsec.

After forming an interlayer insulating layer 102 which covers the transistor 101, a contact hole reaching high-concentration impurity regions 121*a* and 121*b* (serving as a drain or a source) of the transistor 101 through the interlayer insulating layer 102 is formed. Here, the interlayer insulating layer 102 is not limited in particular, and may be a layer made from an inorganic substance such as silicon oxide or silicon nitride, a layer made from siloxane in which a skeleton is composed of the bond of silicon (Si) and oxygen (O) and at least hydrogen is contained as a substituent, or a layer made from an organic substance such as acrylic or polyimide. Further, a layer including both a layer made from the inorganic substance and a layer made from the organic substance may be used.

Then, a wiring 103 connected to the transistor 101 through the contact hole provided for the interlayer insulating layer 102 is formed over the interlayer insulating layer 102. Here, the wiring 103 is not limited in particular; however, the wiring 103 is preferably formed from a low resistant substance such as aluminum or copper. Especially, aluminum containing one or both of carbon and titanium (Ti) is preferable. Thus, ohmic contact between the wiring 103 and an electrode 105 which is formed in a subsequent step is easily made by forming the wiring 103 with the use of a material having high standard electrode potential. Here, titanium (Ti) is preferably contained in aluminum at a rate of from 0.1 wt % to 5 wt %. In addition, carbon is preferably contained in aluminum at a rate of from 1 wt % to 5 wt %.

Then, an interlayer insulating layer 104 having a contact hole reaching the wiring 103 is formed. The interlayer insulating layer 104 is not limited in particular, and may be a layer made from an inorganic substance such as silicon oxide or silicon nitride, a layer made from an organic substance such as acrylic or polyimide, or a layer made from siloxane. Further, a layer including two or more layers selected from the layer made from an inorganic substance, the layer made from an organic substance and the layer made from siloxane may be used.

An electrode 105 which is connected to the wiring 103 through the contact hole provided for the interlayer insulating layer 104 is formed over the interlayer insulating layer 104. Here, the electrode 105 is not limited in particular; however, the electrode 105 is preferably formed using indium oxide or the like containing titanium oxide as well as indium tin oxide (ITO) containing titanium oxide. Content of titanium oxide is preferably from 1 wt % to 20 wt %, and more preferably, 2 wt % to 10 wt %. In addition to titanium oxide, indium tin oxide or indium oxide further containing silicon oxide is preferably used. Here, content of silicon oxide is preferably from 3 wt % to 6 wt %, and more preferably, 5 wt %. Zinc oxide of from 2% to 20% may be preferably contained in indium oxide. UV irradiation is performed on the electrode 105 formed thus using indium tin oxide containing titanium oxide or indium oxide containing titanium oxide to enhance a hydrophilic property of the surface of the electrode 105.

A bank layer 110 for which an opening portion is provided so as to expose the part of the electrode 105 is formed. The bank layer 110 is not limited in particular; however, the radius of curvature of the edge portion of the bank layer 110 is preferably varied continuously. The bank layer 110 can be formed using an inorganic substance such as silicon oxide as well as siloxane or an organic substance such as acrylic or a resist. The bank layer 110 may be a layer formed using one of an inorganic film, siloxane and an organic film, or may be a layer including two or more layers selected from the inorganic film, siloxane and the organic film.

After performing UV irradiation over the electrode 105 to enhance a hydrophilic property of the surface of the electrode 105, solution containing a high molecular weight material having a hole transporting property such as poly(ethylene dioxythiophene)/poly(styrene sulfonate) aqueous solution (PEDOT/PSS aqueous solution) is applied over the electrode 105 with a spin-coating method. Here, the upper surface of the electrode 105 has a hydrophilic property; therefore, the solution can be favorably applied over the whole surface of the electrode without being repelled. After the application, drying is performed to form an organic layer 106. The high molecular weight material is not limited in particular, and the organic layer 106 can be formed using a material different from that of the PEDOT/PSS aqueous solution. However, a material having a hole transporting property is preferably used, and more preferably, a material having hole mobility of 10$^{-6}$ cm$^2$/Vs or more is used. The organic layer 106 may be formed using solution containing a low molecular weight material as well as a high. molecular weight material. Quenching due to the electrode 105 can be prevented by thus providing the organic layer 106. A method for forming the organic layer 106 is not limited in particular, and the organic layer 106 may be formed by a wet method using a drawing means such as an ink-jet method which can form a pattern by controlling timing, position or the like of supplying a liquid, as well as a spin-coating method.

Then, a light emitting layer 107 is formed over the organic layer 106. The light emitting layer 107 is not limited in particular, and may include a light emitting substance. The light emitting layer 107 may be formed using either a low molecular weight material or a high molecular weight material. For example, a metal complex or the like such as bis[2-(2-hydroxyphenyl)pyridinato]zinc (abbreviated to Znpp$_2$) or bis[2-(2-hydroxyphenyl)benzoxazolate]zinc (abbreviated to ZnBOX), as well as an anthracene derivative such as 2-tert-butyl-9,10-di(2-naphthyl)-anthracene (abbreviated to t-BuDNA) or a carbazole derivative such as 4,4'-bis(N-carbazolyl)biphenyl (abbreviated to CBP) can be used as a low molecular weight material. A light emitting substance contained in the light emitting layer 107 is not limited in particular as well as a low molecular weight material, and for example, in the case of obtaining red light emission, a substance which exhibits light emission having the peak of emission spectrum from 600 nm to 680 nm such as 4-dicyanomethylene-2-isopropyl-6-[2-(1,1,7,7-tetramethyljulolidine-9-yl)ethenyl]-4H-pyran (abbreviated to DCJTI), 4-dicyanomethylene-2-methyl-6-[2-(1,1,7,7-tetramethyljulolidine-9-yl)ethenyl]-4H-pyran (abbreviated to DCJT), 4-dicyanomethylene-2-tert-butyl-6-[2-(1,1,7,7-tetramethyl-julolidine-9-yl)ethenyl]-4H-pyran (abbreviated to DCJTB), periflanthene, 2,5-dicyano-1,4-bis[2-(10-methoxy-1,1,7,7-tetramethyljulolidine-9-yl)ethenyl]benzene can be used. In the case of obtaining green light emission, a substance which exhibits light emission having the peak of emission spectrum from 500 nm to 550 nm such as N,N'-dimethylquinacridone (abbreviated to DMQd), coumarin 6, coumarin 545T, tris(8-quinolinolato)aluminum (abbreviated to $Alq_3$) can be used. In the case of obtaining blue light emission, a substance which exhibits light emission having the peak of emission spectrum from 420 nm to 500 nm such as 2-tert-butyl-9,10-di(2-naphthyl)-anthracene (abbreviated to t-BuDNA), 9,9'-bianthlyl, 9,10-diphenylanthracene (abbreviated to DPA), 9,10-bis(2-naphthyl)anthracene (abbreviated to DNA), bis(2-methyl-8-quinolinolato)-4-phenylphenolate-gallium (abbreviated to BGaq), or bis(2-methyl-8-quinolinolato)-4-phenylphenolate-aluminum (abbreviated to BAlq) can be used. A polyalkylthiophene derivative, a polydialkylfluorene derivative, a polyparaphenylene derivative, or the like as well as a polyparaphenylvinylene derivative can be used as a high molecular weight material.

An electrode 108 is formed over the light emitting layer 107. The electrode 108 is not limited in particular, and indium tin oxide or the like can be used as well as aluminum, silver, gold, or the like. The above mentioned indium tin oxide or indium oxide-each containing titanium oxide may be used.

An electron transporting layer, an electron injecting layer, or the like may be provided between the light emitting layer 107 and the electrode 108, if required. Quenching due to the electrode 108 can be prevented by providing the electron transporting layer. An electron is easily injected from the electrode 108 to the light emitting layer 107 by providing the electron injecting layer. Here, a material forming the electron transporting layer is not limited in particular, and a metal complex or the like having a quinoline skeleton or a benzoquinoline skeleton, such as tris(8-quinolinolato)aluminum (abbreviated to $Alq_3$), tris(5-methyl-8-quinolinolato)aluminum (abbreviated to $Almq_3$), bis(10-hydroxybenzo[h]-quinolinato)beryllium (abbreviated to $BeBq_2$), or bis(2-methyl-8-quinolinolato)-4-phenylphenolate-aluminum (abbreviated to BAlq), may be used. In addition to this, a metal complex having an oxazole-based or thiazole-based ligand, such as bis[2-(2-hydroxyphenyl)-benzoxazolato]zinc (abbreviated to $Zn(BOX)_2$) or bis[2-(2-hydroxyphenyl)-benzothiazolato] zinc (abbreviated to $Zn(BTZ)_2$), may be used. In addition, 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), bathocuproin (abbreviated to BCP), or the like may be used. Further, the electron injecting layer is not limited in particular, and a material formed using a compound of alkali metal or alkali earth metal, such as lithium fluoride (LiF), cesium fluoride (CsF), or calcium fluoride ($CaF_2$), can be used. In addition to this, an object in which a substance having a high electron transporting property such as $Alq_3$ or 4,4-bis(5-methylbenzoxazolyl-2-yl)stilbene (abbreviated to BzOs) and alkali metal such as lithium or alkali earth metal such as magnesium is mixed can be used.

Figure 2A:
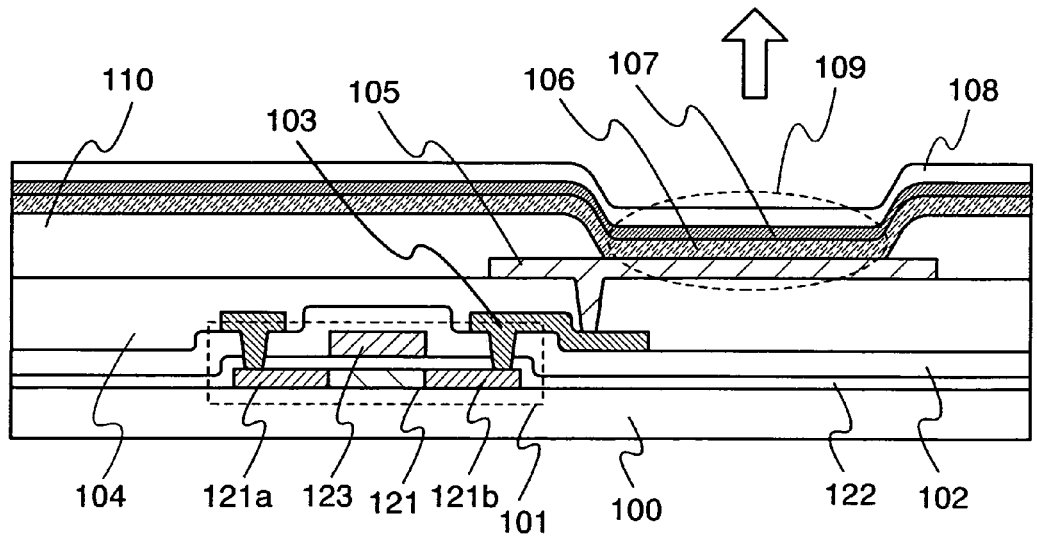
FIGS. 2A and 2B are explanatory views of a light emitting element and a light emitting device according to the invention.
Figure 2B:
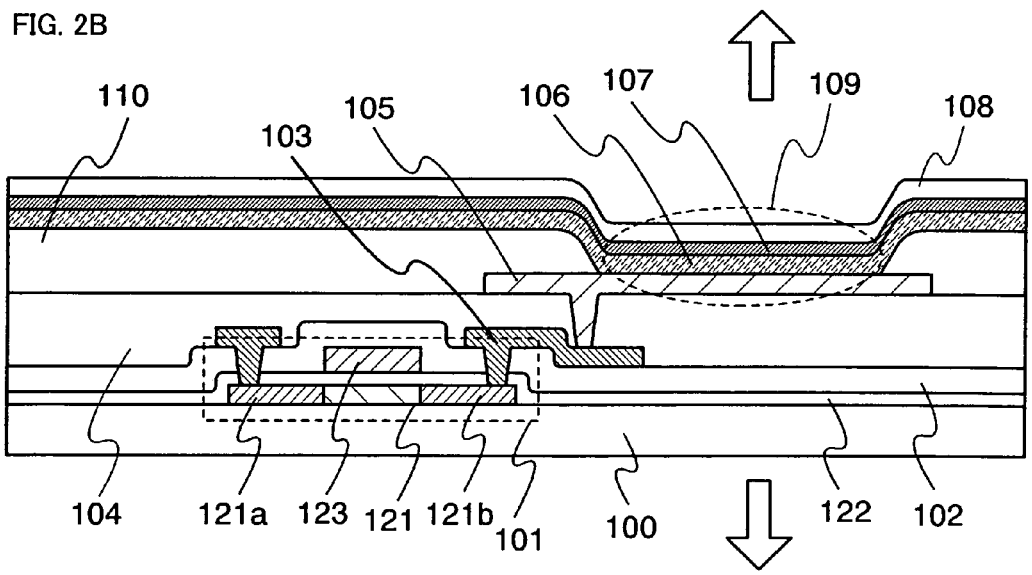

A light emitting device including a light emitting element 109 having the light emitting layer 107 between the electrode 105 and the electrode 108 can be manufactured as described above. One or both of the electrode 105 and the electrode 108 are preferably formed from a material which can transmit visible light. For example, when only the electrode 105 is formed from a material which can transmit visible light, light from the light emitting layer 107 is emitted through the electrode 105 as shown by an outline arrow in FIG. 1. Alternatively, when only the electrode 108 is formed from a material which can transmit visible light, light from the light emitting layer 107 is emitted through the electrode 108 as shown by an outline arrow in FIG. 2A. When both of the electrodes 105 and 108 are formed from a material which can transmit visible light, light from the light emitting layer 107 is emitted through each of the electrodes 105 and 108 as shown by an outline arrow in FIG. 2B.

In the above-described light emitting device of the invention, light is emitted when a light emitting substance excited by current which flows between the electrode 105 and the electrode 108 returns to the ground state. According to the above-described light emitting device of the invention, a layer made from a high molecular weight material can be favorably formed, and ohmic contact between the wiring 103 and the electrode 105 of the light emitting element 109 is easily made and current can be favorably supplied from the transistor 101.

Embodiment Mode 2

In this embodiment mode, a light emitting device according to the present invention including a bottom-gate transistor 201 is described with reference to FIGS. 3A and 3B.

Figure 3A:
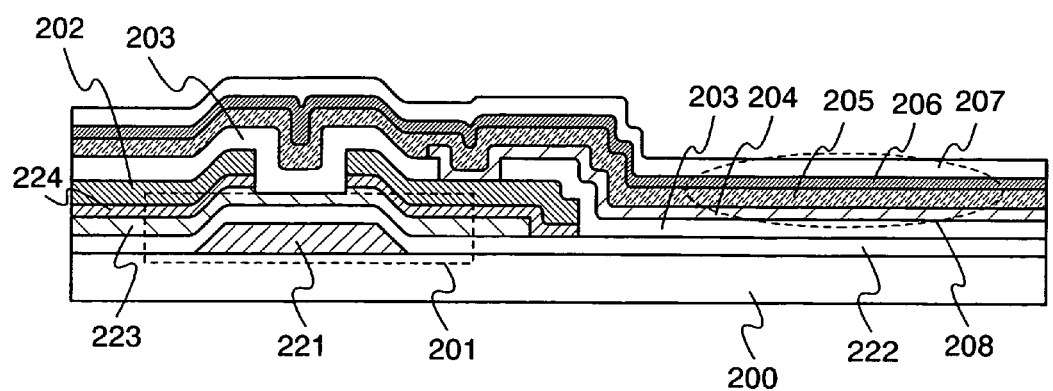
FIGS. 3A and 3B are explanatory views of a light emitting element and a light emitting device according to the invention.

In FIG. 3A, a gate electrode 221 is formed over a substrate 200, and a gate insulating layer 222 which covers the gate electrode 221 is further formed. A semiconductor layer 223 is further formed over a portion in which the gate insulating layer 222 overlaps the gate electrode 221. An N-type semiconductor layer 224 is formed over a region except a channel formation region in the semiconductor layer 223.

Thus, the bottom-gate transistor 201 including the gate electrode 221, the gate insulating layer 222, the semiconductor layer 223, and the N-type semiconductor layer 224 is electrically connected to a wiring 202 since the N-type semiconductor layer 224 is in contact with the wiring 202.

Further, similarly to the semiconductor layer 121 mentioned in Embodiment Mode 1, the semiconductor layer 224 is not limited in particular, and may be a semi-amorphous layer or the like as well as a layer containing crystalline component and a layer containing non-crystalline component. The N-type semiconductor layer 224 is a layer containing an N-type impurity such as phosphorous or arsenic.

The wiring 202 is not limited in particular; however, the wiring 202 is preferably formed from a low resistant substance such as aluminum or copper. Especially, aluminum containing one or both of carbon and titanium (Ti) is preferable. Ohmic contact between the wiring 202 and an electrode 204 which is formed in a subsequent step is easily made by thus forming the wiring 202 with the use of a material having high standard electrode potential. Here, titanium (Ti) is preferably contained in the wiring 202 at a rate of from 0.1 wt % to 5 wt % to aluminum. In addition, carbon is preferably contained in the wiring 202 at a rate of from 1 wt % to 5 wt % to aluminum.

The wiring 202 is covered with an interlayer insulating layer 203 provided with a contact hole reaching the wiring 202. An electrode 204 is electrically connected to the wiring 202 through the contact hole.

Here, the electrode 204 is not limited in particular; however, the electrode 204 is preferably formed using indium oxide or the like containing titanium oxide as well as indium tin oxide (ITO) containing titanium oxide. Content of titanium oxide is preferably from 1 wt % to 20 wt %, and more preferably, 2 wt % to 10 wt %. In addition to titanium oxide, indium tin oxide or indium oxide further containing silicon oxide is preferably used. Here, content of silicon oxide is preferably from 3 wt % to 6 wt %, and more preferably, 5 wt %. Further, zinc oxide of from 2% to 20% may be preferably contained in indium oxide. UV irradiation is performed to the electrode 204 which is formed thus using indium tin oxide or indium oxide containing titanium oxide; accordingly, a hydrophilic property of the surface of the electrode 204 can be enhanced.

An organic layer 205 is formed over the electrode 204. The organic layer 205 is not limited in particular; however, the organic layer 205 is preferably a layer formed using a high molecular weight material such as poly(ethylene dioxythiophene)/poly(styrene sulfonate) aqueous solution (PEDOT/PSS aqueous solution). Accordingly, unevenness is relieved even in the case where the surface of the electrode 204 has unevenness, and a poor element due to short circuit or the like between electrodes is hard to be generated. The method for forming the organic layer 205 is not limited in particular, and the organic layer 205 can be formed by applying with a wet method using a drawing means or the like such as an ink-jet method which can form a pattern by controlling timing, position of supplying a liquid, or the like as well as a spin-coating method, and then by drying it. Here, the organic layer 205 is preferably formed over an electrode in which a hydrophilic property of the surface thereof is enhanced, such as the electrode 204 in this embodiment mode. Therefore, the PEDOT/PSS aqueous solution or the like can be favorably applied with a wet method without being repelled over the electrode 204.

A light emitting layer 206 is formed over the organic layer 205. The light emitting layer 206 is similar to the light emitting layer 107 mentioned in Embodiment Mode 1. An electrode 207 is formed over the light emitting layer 206. The electrode 207 is similar to the electrode 108 mentioned in Embodiment Mode 1.

In the above-described light emitting device including a light emitting element 208 having the light emitting layer 206 between the electrode 204 and the electrode 207, one or both of the electrode 204 and the electrode 207 are preferably formed from a material which can transmit visible light.

In the above-described light emitting device of the invention, light is emitted when a light emitting substance excited by current which flows between the electrode 204 and the electrode 207 returns to the ground state. According to the above-described light emitting device of the invention, a layer made from a high molecular weight material can be favorably formed. And also ohmic contact between the wiring 202 and the electrode 204 of the light emitting element 208 is easily made and thus current from the transistor 201 can be favorably supplied.

Figure 3B:
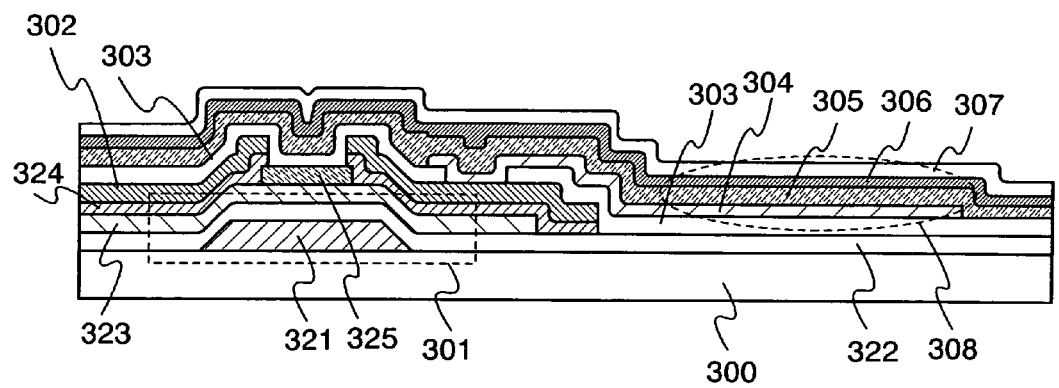

A transistor may be a channel protection transistor 301 as shown in FIG. 3B as well as a channel etched transistor as shown in FIG. 3A. In FIG. 3B, the transistor 301 is provided over a substrate 300 and has a protective layer 325 provided so as to be in contact with a semiconductor layer 323 over a portion where the semiconductor layer 323 overlaps a gate insulating layer 322 and the gate insulating layer 322 overlaps the gate electrode 321. In such a transistor, a channel formation region is formed in a portion of semiconductor layer 323 overlapped with the protective layer 325. An N-type semiconductor layer 324 is formed over a region different from a region overlapped with the protective layer 325 in the semiconductor layer 323.

The wiring 302 is stacked over the N-type semiconductor layer 324 to be electrically connected to each other. The wiring 302 is covered with an interlayer insulating layer 303 provided with a contact hole. The electrode 304 reaches the wiring 302 to be connected to each other through the contact hole. An organic layer 305, a light emitting layer 306, and an electrode 307 are sequentially stacked over the electrode 304, and a light emitting element 309 having a light emitting layer 306 between the electrode 304 and the electrode 307 is formed.

The wiring 302, the electrode 304, the organic layer 305, the light emitting layer 306, and the electrode 307 are similar to the wiring 202, the electrode 204, the organic layer 205, the light emitting layer 206, and the electrode 207 described above, respectively.

Embodiment Mode 3

In this embodiment mode, a circuit configuration and a driving method of a light emitting device having a display function, which is a light emitting device as described in Embodiment Mode 1, are described with reference to FIGS. 3A to 6.

Figure 4:
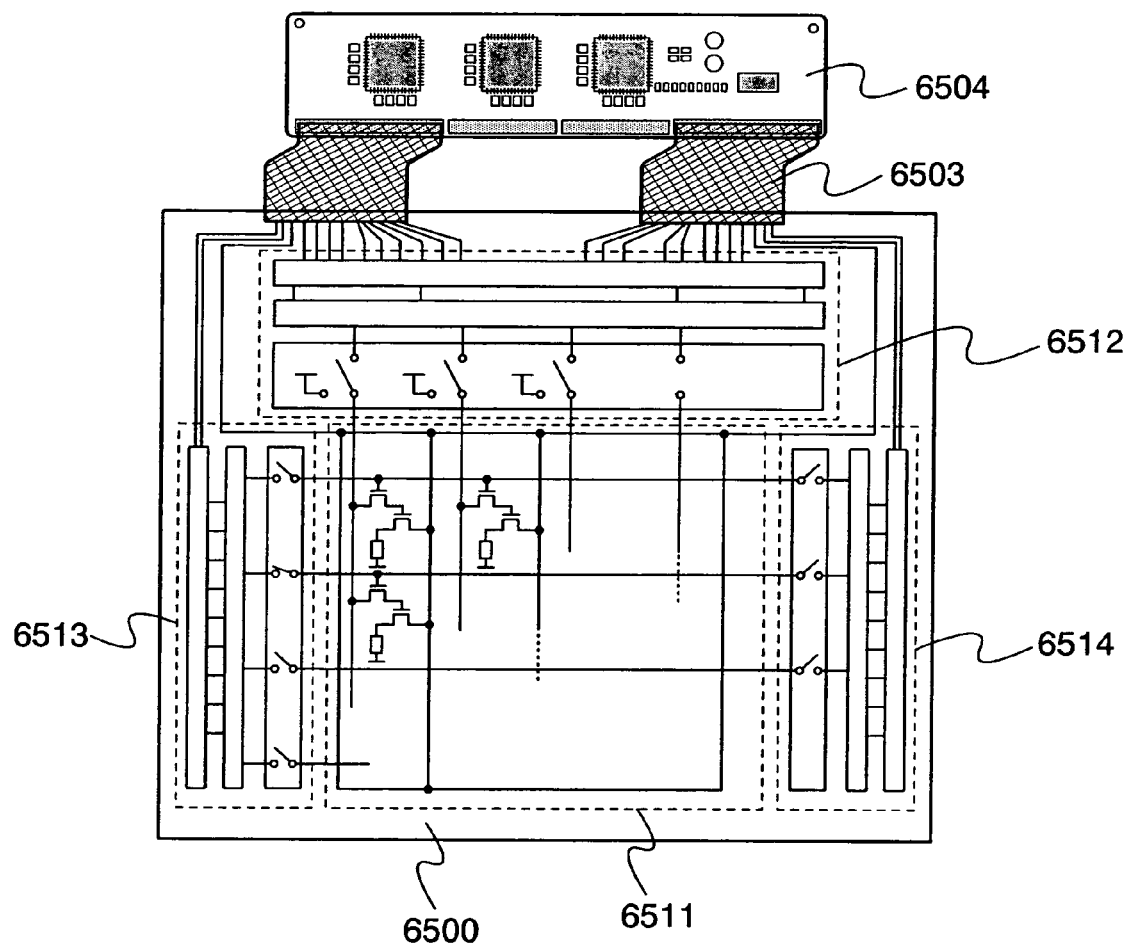
FIG. 4 is an explanatory view of a light emitting device according to the invention.

FIG. 4 is a schematic top view of a light emitting device to which the present invention is applied. In FIG. 4, a pixel portion 6511, a source signal line driver circuit 6512, a writing gate signal line driver circuit 6513, and an erasing gate signal line driver circuit 6514 are provided over a substrate 6500. The source signal line driver circuit 6512, the writing gate signal line driver circuit 6513, and the erasing gate signal line driver circuit 6514 each are connected to an FPC (Flexible Printed Circuit) 6503 which is an external input terminal through a group of wirings. The source signal line driver circuit 6512, the writing gate signal line driver circuit 6513, and the erasing gate signal line driver circuit 6514 each receives a video signal, a clock signal, a start signal, a reset signal, and the like through the FPC 6503. A printed wiring board (PWB) 6504 is attached to the FPC 6503. A driver circuit portion is not required to be provided over the same substrate as that of the pixel portion 6511 as described above, and for example, may be provided in an external portion of the substrate with the use of a driver circuit portion in which an IC chip is mounted over the FPC in which a wiring pattern is formed (TCP) or the like.

In the pixel portion 6511, a plurality of source signal lines extended in a column direction are arranged in a row direction and power supply lines are arranged in the row direction. In the pixel portion 6511, a plurality of gate signal lines extended to the row direction are arranged in the column direction. Further, in the pixel portion 6511, a plurality of pixel circuits each including the light emitting element are arranged.

Figure 5:
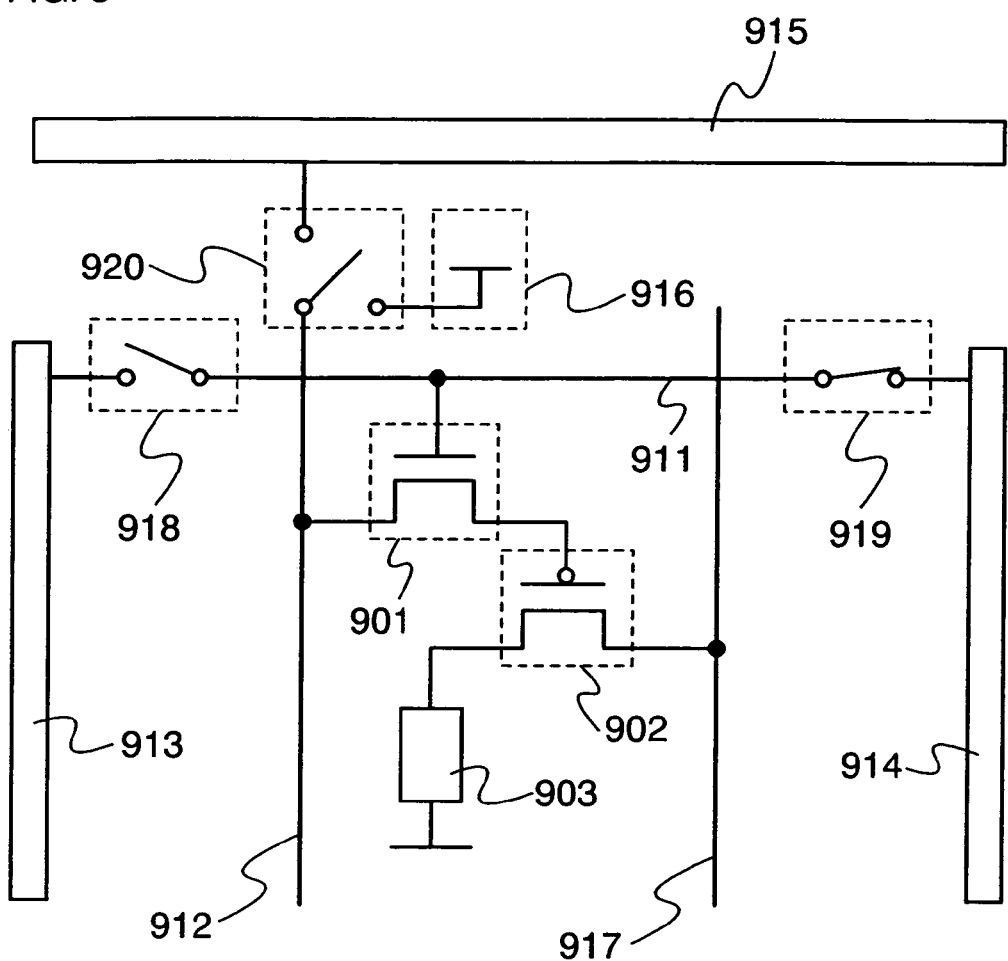
FIG. 5 is an explanatory diagram of a circuit included in a light emitting device according to the invention.

FIG. 5 is a diagram showing a circuit for operating one pixel. A first transistor 901, a second transistor 902, and a light emitting element 903 are included in the circuit shown in FIG. 5.

The first transistor 901 and the second transistor 902 each are a three-terminal element including a gate electrode, a drain region, and a source region, and has a channel formation region between the drain region and the source region. Here, since the source region and the drain region are determined according to the structure, operation condition, or the like of the transistor, it is difficult to confine which is the source region or the drain region. Therefore, in this embodiment mode, regions which serve as a source or a drain are respectively referred to as a first electrode of the transistor and a second electrode of the transistor.

A gate signal line 911 and a writing gate signal line driver circuit 913 are provided so as to be electrically connected or not to be electrically connected to each other through a switch 918. The gate signal line 911 and an erasing gate signal line driver circuit 914 are provided so as to be electrically connected or not to be electrically connected to each other through a switch 919. A source signal line 912 is provided so as to be electrically connected to one of a source signal line driver circuit 915 and a power source 916 through a switch 920. A gate of the first transistor 901 is electrically connected to the gate signal line 911. A first electrode of the first transistor is electrically connected to the source signal line 912 and a second electrode thereof is electrically connected to the gate electrode of the second transistor 902. A first electrode of the second transistor 902 is electrically connected to a power supply line 917, and a second electrode thereof is electrically connected to one of electrodes included in the light emitting element 903. Further, the switch 918 may be included in the writing gate signal line driver circuit 913. The switch 919 may be also included in the erasing gate signal line driver circuit 914. In addition, the switch 920 may be included in the source signal line driver circuit 915.

Figure 6:
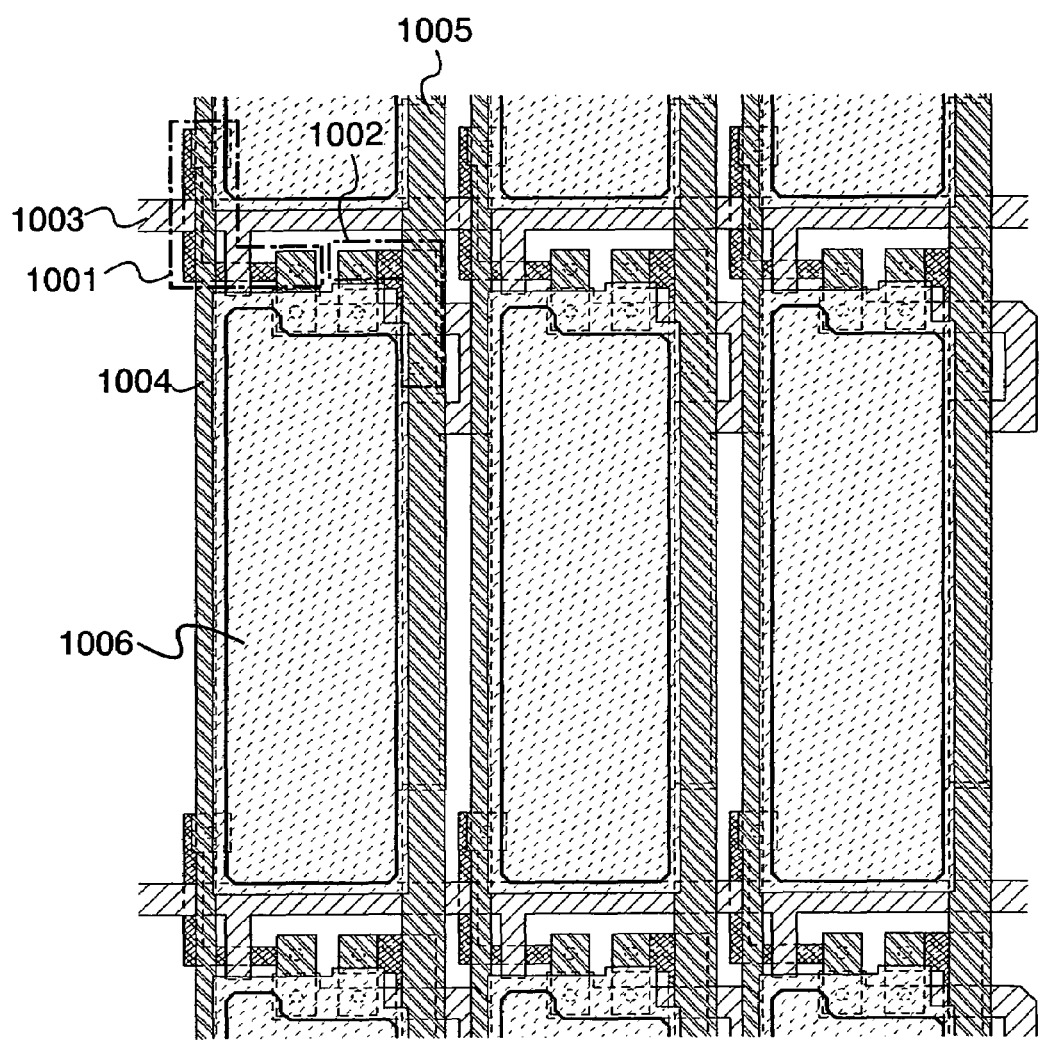
FIG. 6 is a top view of a light emitting device according to the invention.

The arrangement of the transistor, a light emitting element, or the like in the pixel portion is not limited in particular; however, for example, the transistor, a light emitting element, or the like can be arranged as shown in a top view of FIG. 6. In FIG. 6, a first electrode of a first transistor 1001 is connected to a source signal line 1004, and a second electrode thereof is connected to a gate electrode of a second transistor 1002. A first electrode of the second transistor is connected to a power supply line 1005, and a second electrode is connected to an electrode 1006 of the light emitting element. A part of the gate signal line 1003 serves as a gate electrode of the first transistor 1001.

Figure 7:
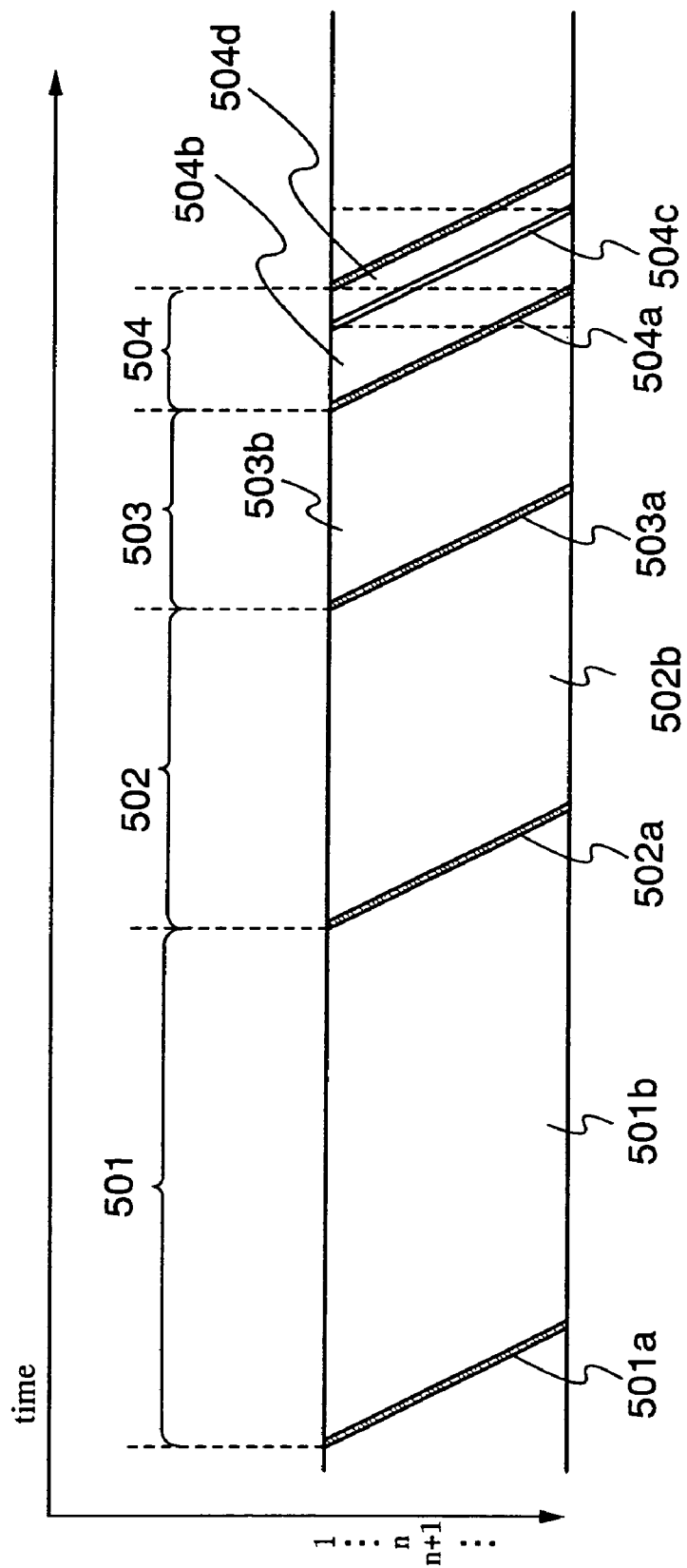
FIG. 7 is an explanatory view of frame operation of a light emitting device to which the invention is applied.

Next, a driving method is explained. FIG. 7 is an explanatory view of an operation of a frame with time. In FIG. 7, the abscissa-axis direction represents time passage, whereas the ordinate-axis direction represents scanning stages of a gate signal line.

When an image is displayed with a light emitting device according to the invention, a rewriting operation and a displaying operation are repeatedly carried out in a display period. The number of rewriting operations is not especially limited; however, the rewriting operation is preferably performed approximately sixty times per one second so that a person who watches the image does not find flickering. Herein, the period when the operations of rewriting and displaying of one image (one frame) are carried out is referred to as one frame period.

One frame period is time-divided into four sub frame periods 501, 502, 503, and 504 including writing periods 501a, 502a, 503a, and 504a, and retention periods 501b, 502b, 503b, and 504b as shown in FIG. 7. A light emitting element that receives a light-emission signal emits light in the retention period. The length ratio of the retention period in each sub frame is the first sub frame period 501: the second sub frame period 502: the third sub frame period 503: the fourth sub frame period $504 = 2^3:2^2:2^1:2^0 = 8:4:2:1$. Accordingly, a 4-bit gray scale can be realized. The number of bits or gray scale levels is not limited thereto. For instance, an 8-bit gray scale can be offered by providing eight sub frame periods.

An operation in one frame period is explained. Firstly, a writing operation is carried out from the first row to the last row sequentially in the sub frame period 501. Therefore, the starting time of a writing period is different depending on the rows. The retention period 501b starts sequentially from the row where the writing period 501a is completed. In the retention period, a light emitting element that receives a light-emission signal emits light. The next sub frame period 502 starts sequentially from the row where the retention period 501b is completed, and a writing operation is carried out from the first row to the last row sequentially as is the case with the sub frame period 501. Operations as noted above are repeatedly carried out to finish the retention period 504b of the sub frame period 504. When an operation in the sub frame period 504 is finished, an operation in the next frame period is started. The sum of emitting light in each of the sub frame periods is an emitting time of each light emitting element in one frame period. By varying the emitting time for each light emitting element and combining the emitting time variously in one pixel, various colors can be displayed with different brightness and chromaticity.

When a retention period in the row where writing has been finished before finishing the writing of the last row and the retention period has started is intended to be terminated forcibly, an erasing period 504c is provided after the retention period 504b to control so that the light emission is forcibly stopped. The row where the light emission is forcibly stopped does not emit light during a fixed period (the period is referred to as a non-emission period 504d). Upon finishing the writing period of the last row, the next writing period (or a frame period) starts from the first row. Therefore, it can be prevented that the writing period of the sub frame 504 is overlapped with the writing period of the next sub frame.

In this embodiment mode, the sub frame periods 501 to 504 are arranged in the order from the longest retention period; however, the invention is not limited thereto. For instance, the sub frame periods 501 to 504 may be arranged in the order from the shortest retention period. The sub frame periods 501 to 504 may be arranged at random combining short sub frame periods and long sub frame periods. The sub frame period may be further divided into a plurality of frame periods. That is, scanning of the gate signal line can be carried out a plurality of times during the period of giving the same video signal.

An operation of the circuit shown in FIG. 5 in a writing period and an erasing period is explained.

First, an operation in the writing period is explained. In the writing period, the gate signal line 911 at the n-th row (n is a natural number) is electrically connected to the writing gate signal line driver circuit 913 through the switch 918. The gate signal line 911 is not connected to the erasing gate signal line driver circuit 914. The source signal line 912 is electrically connected to the source signal line driver circuit through the switch 920. A signal is inputted to the gate of the first transistor 901 connected to the gate signal line 911 at the n-th row (n is a natural number), and the first transistor 901 is turned ON. At this time, video signals are simultaneously inputted to the source signal lines at the first column to the last column. Video signals inputted from the source signal line 912 at each column are independent from each other. The video signal inputted from the source signal line 912 is inputted to the gate electrode of the second transistor 902 through the first transistor 901 connected to each source signal line. The signal inputted to the second transistor 902 determines a light emitting state or a non emission state of the light emitting element 903. For example, in the case that the second transistor 902 is a P-channel type, the light emitting element 903 emits light when a Low Level signal is inputted to the gate electrode of the second transistor 902. On the other hand, in the case that the second transistor 902 is an N-channel type, the light emitting element 903 emits light when a High Level signal is inputted to the gate electrode of the second transistor 902.

Then, an operation in the erasing period is explained. In the erasing period, the gate signal line 911 of the n-th row (n is a natural number) is electrically connected to the erasing gate signal line driver circuit 914 through the switch 919. The gate signal line 911 is not connected to the writing gate signal line driver circuit 913. The source signal line 912 is electrically connected to the power source 916 through the switch 920. A signal is inputted to the gate of the first transistor 901 connected to the gate signal line 911 at the n-th row, and the first transistor 901 is turned ON. At this time, signals for erasing are simultaneously inputted to the source signal lines at the first column to the last column. The signal for erasing inputted from the source signal line 912 is inputted to the gate electrode of the second transistor 902 through the first transistor 901 connected to each source signal line. By the signal inputted to the second transistor 902, current supply from the current supply line 917 to the light emitting element 903 is stopped. The light emitting element 903 does not emit light forcibly. For example, in the case that the second transistor 902 is a P-channel type, the light emitting element 903 does not emit light when a High Level signal is inputted to the gate electrode of the second transistor 902. On the other hand, in the case that the second transistor 902 is an N-channel type, the light emitting element 903 does not emit light when a Low Level signal is inputted to the gate electrode of the second transistor 902.

In the erasing period, a signal for erasing is inputted to the n-th row (n is a natural number) by the operation as described above. However, there is a case that the n-th row is in an erasing period and another row (the m-th row (m is a natural number) in this instance) is in a writing period. In this instance, it is required that a signal for erasing is inputted to the n-th row and a signal for writing is inputted to the m-th row by utilizing a source signal line of the same column. Accordingly, an operation explained as follows is preferably carried out.

Immediately after the light emitting element 903 at the n-th row is brought into a non emission state by the above-described operation in the erasing period, the gate signal line is disconnected from the erasing gate signal line driver circuit 914, and the source signal line 912 is connected to the source signal line driver circuit 915 by changing the switch 920. As well as connecting the source signal line to the source signal line driver circuit 915, the gate signal line is connected to the writing gate signal line driver circuit 913. A signal is selectively inputted to the signal line at the m-th row from the writing gate signal line driver circuit 913, and when the first transistor is turned ON, signals for writing are inputted to the source signal lines at the first column to the last column from the source signal line driver circuit 915. The light emitting element at the m-th row emits light or does not emit light depending on the signal.

Immediately after finishing the writing period of the m-th row as noted above, an erasing period at the (n+1)-th row starts. Hence, the gate signal line and the writing gate signal line driver circuit 913 are disconnected, and the source signal line 912 and the power source 916 are connected by changing the switch 920. Further, the gate signal line and the writing gate signal line driver circuit 913 are disconnected, and the gate signal line is connected to the erasing gate signal line driver circuit 914. When a signal is selectively inputted to the gate signal line at the (n+1)-th row from the erasing gate signal line driver circuit 914, and the first transistor is turned ON, an erasing signal is inputted from the power source 916. Immediately after finishing the erasing period at the (n+1)-th row, a writing period at the m-th row starts. Hereinafter, an erasing period and a writing period may be carried out repeatedly to operate to complete an erasing period of the last row.

In this embodiment mode, a mode in which the writing period at the m-th row is provided between the erasing period of the n-th row and the erasing period of the (n+1)-th row is explained. Without being limited to this, however, the writing period of the m-th row may be provided between the erasing period at (n−1)-th row and the erasing period at the n-th row.

In this embodiment mode, when providing the non emission period 504d as in the sub frame period 504, an operation of disconnecting the erasing gate signal line driver circuit 914 from a certain gate signal line and connecting the writing gate signal line driver circuit 913 to another gate signal line is repeatedly carried out. Such an operation may be carried out in a frame period that is not provided with a non emission period.

Embodiment Mode 4

An electronic device which can perform favorable display or an electric product which can favorably light for a long time can be obtained by mounting a light emitting device of the present invention.

Figure 8A:
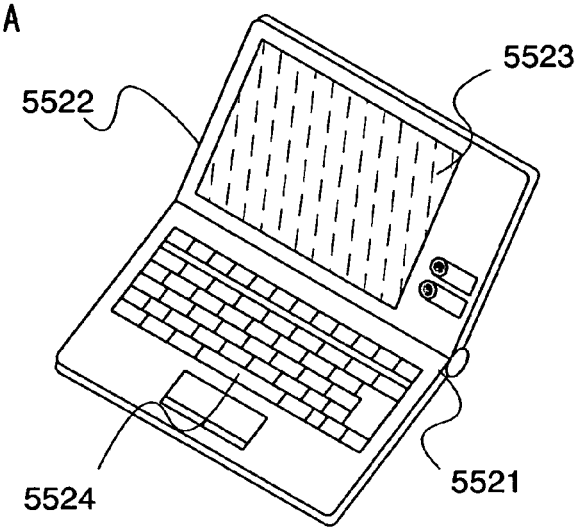
FIGS. 8A to 8C are electronic devices to which the invention is applied.
Figure 8B:
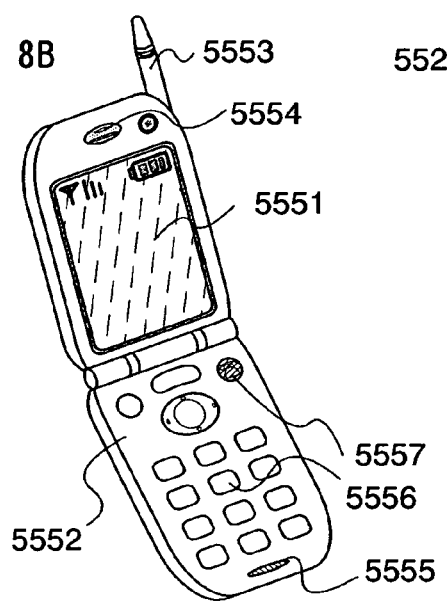
Figure 8C:
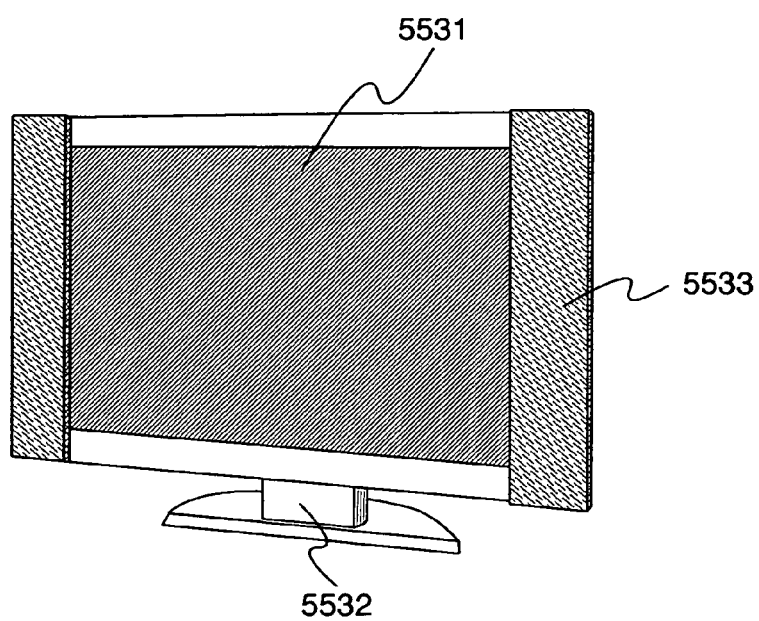

FIGS. 8A to 8C show one embodiment of an electronic device mounted with the light emitting device to which the invention is applied.

FIG. 8A is a personal computer manufactured by applying the invention, which includes a main body 5521, a casing 5522, a display portion 5523, a keyboard 5524, and the like. The personal computer can be completed by incorporating the light emitting device having the light emitting element of the invention as a display portion.

FIG. 8B is a cellular phone manufactured by applying the invention, and a main body 5552 includes a display portion 5551, an audio output portion 5554, an audio input portion 5555, operation switches 5556 and 5557, an antenna 5553, and the like. The cellular phone can be completed by incorporating the light emitting device having the light emitting element of the invention as a display portion.

FIG. 8C is a TV set manufactured by applying the invention, which includes a display portion 5531, a casing 5532, a speaker 5533, and the like. The TV set can be completed by incorporating the light emitting device having the light emitting element of the invention as a display portion.

As described above, the light emitting device of the invention is extremely suitable as a display portion of various electronic devices.

In this embodiment mode, the personal computer and the like are described; however, in addition to this, the light emitting device having a light emitting element of the invention may be mounted to a navigation system, a lightning apparatus, or the like. The invention may be used for a display device other than a light emitting device, for example, a pixel electrode of a liquid crystal display device. Further, the invention can be used for a general semiconductor device other than a display device.

This application is based on Japanese Patent Application serial No. 2004-174852 field in Japan Patent Office on Jun. 11, 2004, the contents of which are hereby incorporated by reference.

What is claimed is:

1. A light emitting device comprising:
   a substrate;
   a transistor formed over the substrate;
   a wiring electrically connected to the transistor;
   an interlayer insulating layer formed over the wiring and comprising an opening; and
   a light emitting element formed over the interlayer insulating layer comprising:
      a first conductive layer comprising titanium oxide;
      an organic layer over the first conductive layer;
      a light emitting layer over the organic layer; and
      a second conductive layer over the light emitting layer,
      wherein the organic layer is in contact with the first conductive layer,
      wherein the first conductive layer is electrically connected to the transistor through the wiring,
      wherein the first conductive layer transmits visible light,
      wherein an upper surface of the first conductive layer has a hydrophilic property,
      wherein the second conductive layer reflects visible light, and
      wherein light from the light emitting layer is emitted through the substrate.

2. The light emitting device according to claim 1, wherein the organic layer is formed by a wet method.

3. The light emitting device according to claim 1, wherein the titanium oxide is contained in the first conductive layer with a content of from 1 wt % to 20 wt %.

4. The light emitting device according to claim 1, wherein a transparent portion of the first conductive layer is in contact with the interlayer insulating layer.

5. The light emitting device according to claim 1 wherein the wiring directly contacts the transistor and the first conductive layer.

6. A light emitting device comprising:
   a substrate;
   a transistor formed over the substrate;
   a wiring electrically connected to the transistor;
   an interlayer insulating layer formed over the wiring and comprising an opening; and
   a light emitting element formed over the interlayer insulating layer comprising:
      a first conductive layer comprising indium tin oxide and titanium oxide;
      an organic layer over the first conductive layer;
      a light emitting layer over the organic layer; and
      a second conductive layer over the light emitting layer,
      wherein the organic layer is in contact with the first conductive layer,
      wherein the first conductive layer is electrically connected to the transistor through the wiring,
      wherein the first conductive layer transmits visible light,
      wherein an upper surface of the first conductive layer has a hydrophilic property,
      wherein the second conductive layer reflects visible light, and
      wherein light from the light emitting layer is emitted through the substrate.

7. The light emitting device according to claim 6, wherein the organic layer is formed by a wet method.

8. The light emitting device according to claim 6, wherein the titanium oxide is contained in the first conductive layer with a content of from 1 wt % to 20 wt %.

9. The light emitting device according to claim 6, wherein a transparent portion of the first conductive layer is in contact with the interlayer insulating layer.

10. The light emitting device according to claim 6 wherein the wiring directly contacts the transistor and the first conductive layer.

11. A light emitting device comprising:
    a substrate;
    a transistor formed over the substrate;
    a wiring electrically connected to the transistor;
    an interlayer insulating layer formed over the wiring and comprising an opening; and
    a light emitting element formed over the interlayer insulating layer comprising:
       a first conductive layer comprising indium tin oxide and titanium oxide;
       an organic layer over the first conductive layer, wherein the first conductive layer is in contact with the organic layer;
       a light emitting layer over the organic layer; and
       a second conductive layer over the light emitting layer,
       wherein the organic layer comprises poly(ethylene dioxythiophene) and poly(styrene sulfonate),
       wherein the first conductive layer is electrically connected to the transistor through the wiring,
       wherein an upper surface of the first conductive layer has a hydrophilic property,
       wherein the second conductive layer reflects visible light, and
       wherein light from the light emitting layer is emitted through the substrate.

12. The light emitting device according to claim 11, wherein the titanium oxide is contained in the first conductive layer with a content of from 1 wt % to 20 wt %.

13. The light emitting device according to claim 11, wherein a transparent portion of the first conductive layer is in contact with the interlayer insulating layer.

14. The light emitting device according to claim 11 wherein the wiring directly contacts the transistor and the first conductive layer.

15. A light emitting device comprising:
    a substrate;
    a transistor formed over the substrate;
    a wiring electrically connected to the transistor;
    an interlayer insulating layer formed over the wiring and comprising an opening; and
    a light emitting element formed over the interlayer insulating layer comprising:
       a first conductive layer comprising titanium oxide;
       an organic layer over the first conductive layer, wherein the organic layer is in contact with the first conductive layer;
       a light emitting layer over the organic layer; and
       a second conductive layer over the light emitting layer,
       wherein the wiring contains aluminum, carbon, and titanium,
       wherein the first conductive layer is electrically connected to the transistor through the wiring,
       wherein the first conductive layer transmits visible light,
       wherein an upper surface of the first conductive layer has a hydrophilic property,
       wherein the second conductive layer reflects visible light, and wherein light from the light emitting layer is emitted through the substrate.

16. The light emitting element according to claim 15, wherein the organic layer is formed by a wet method.

17. The light emitting device according to claim 15, wherein the titanium contained in the wiring is contained with a content of from 0.1 wt % to 5 wt % to aluminum.

18. The light emitting device according to claim 15, wherein the carbon contained in the wiring is contained with a content of from 0.1 wt % to 5 wt % to aluminum.

19. An electronic device including the light emitting device according to claim 15 used as a display portion.

20. The light emitting device according to claim 15, wherein a transparent portion of the first conductive layer is in contact with the interlayer insulating layer.

21. The light emitting device according to claim 15 wherein the wiring directly contacts the transistor and the first conductive layer.

22. A light emitting device comprising:
a substrate;
a transistor formed over the substrate;
a wiring electrically connected to the transistor;
an interlayer insulating layer formed over the wiring and comprising an opening; and
a light emitting element formed over the interlayer insulating layer comprising:
a first conductive layer formed from indium tin oxide comprising titanium oxide;
an organic layer over the first conductive layer, wherein the organic layer is in contact with the first conductive layer;
a light emitting layer over the organic layer; and
a second conductive layer over the light emitting layer,
wherein the wiring contains aluminum, carbon, and titanium,
wherein the first conductive layer is electrically connected to the transistor through the wiring,
wherein an upper surface of the first conductive layer has a hydrophilic property,
wherein the second conductive layer reflects visible light, and
wherein light from the light emitting layer is emitted through the substrate.

23. The light emitting element according to claim 22, wherein the organic layer is formed by a wet method.

24. The light emitting device according to claim 22, wherein the titanium contained in the wiring is contained with a content of from 0.1 wt % to 5 wt % to aluminum.

25. The light emitting device according to claim 22, wherein the carbon contained in the wiring is contained with a content of from 0.1 wt % to 5 wt % to aluminum.

26. An electronic device including the light emitting device according to claim 22 used as a display portion.

27. The light emitting device according to claim 22, wherein a transparent portion of the first conductive layer is in contact with the interlayer insulating layer.

28. The light emitting device according to claim 22 wherein the wiring directly contacts the transistor and the first conductive layer.

29. A light emitting device comprising:
a substrate;
a transistor formed over the substrate;
a wiring electrically connected to the transistor;
an interlayer insulating layer formed over the wiring and comprising an opening; and
a light emitting element formed over the interlayer insulating layer comprising:
a first conductive layer formed from indium tin oxide comprising titanium oxide
an organic layer over the first conductive layer, wherein the first conductive layer is in contact with the organic layer;
a light emitting layer over the organic layer; and
a second conductive layer over the light emitting layer,
wherein the wiring contains aluminum, carbon, and titanium,
wherein the organic layer comprises poly(ethylene dioxythiophene) and poly(styrene sulfonate),
wherein the first conductive layer is electrically connected to the transistor through the wiring,
wherein an upper surface of the first conductive layer has a hydrophilic property,
wherein the second conductive layer reflects visible light, and
wherein light from the light emitting layer is emitted through the substrate.

30. The light emitting device according to claim 29, wherein the titanium contained in the wiring is contained with a content of from 0.1 wt % to 5 wt % to aluminum.

31. The light emitting device according to claim 29, wherein the carbon contained in the wiring is contained with a content of from 0.1 wt % to 5 wt % to aluminum.

32. An electronic device including the light emitting device according to claim 29 used as a display portion.

33. The light emitting device according to claim 29, wherein a transparent portion of the first conductive layer is in contact with the interlayer insulating layer.

34. The light emitting device according to claim 29 wherein the wiring directly contacts the transistor and the first conductive layer.

* * * * *